(12) United States Patent
Lin et al.

(10) Patent No.: US 6,717,444 B2
(45) Date of Patent: Apr. 6, 2004

(54) LOW POWER LATCH SENSE AMPLIFIER

(75) Inventors: Hsiao-Ming Lin, Taoyuan (TW);
Nien-Chao Yang, Hsinchu (TW)

(73) Assignee: Macronix International Co., Ltd.,
Hsinchu (TW)

( * ) Notice: Subject to any disclaimer, the term of this patent is extended or adjusted under 35 U.S.C. 154(b) by 0 days.

(21) Appl. No.: 10/259,489

(22) Filed: Sep. 30, 2002

(65) Prior Publication Data

US 2003/0128055 A1 Jul. 10, 2003

(30) Foreign Application Priority Data

Jan. 10, 2002 (TW) ...................................... 91100272 A

(51) Int. Cl.[7] .............................................. G01R 19/00
(52) U.S. Cl. ........................................................ 327/57
(58) Field of Search ...................................... 327/51–57

(56) References Cited

U.S. PATENT DOCUMENTS

| | | | | |
|---|---|---|---|---|
| 4,434,381 A | * | 2/1984 | Stewart ........................ 327/57 |
| 5,486,779 A | * | 1/1996 | Eitrheim ....................... 327/57 |
| 5,740,112 A | * | 4/1998 | Tanaka et al. ............ 365/189.01 |
| 6,438,051 B1 | * | 8/2002 | Fifield et al. .................. 327/51 |
| 6,535,026 B2 | * | 3/2003 | Chung et al. ................... 327/51 |

* cited by examiner

*Primary Examiner*—My-Trang Nuton
(74) *Attorney, Agent, or Firm*—Rabin & Berdo, P.C.

(57) ABSTRACT

A low power latch sense amplifier for electrically being coupled to a bit line of a memory cell array is disclosed. The low power latch sense amplifier comprises a common gate sense amplifier and an activated latch register. The common gate sense amplifier comprising a current source and a biased metal-oxide semiconductor is applied for sensing the current of the bit line. The current source and the biased MOS are coupled to a first node, and the common gate sense amplifier outputs a sensing signal at the first node. The activated latch register comprises a first clock signal-synchronized inverter which includes a first inverter and a first switch. The first inverter responds to the sensing signal, and the first inverter outputs a first inverter output signal. The first switch is controlled by a first set of control signal, and the first inverter output signal is corresponding to the sensing signal when the first switch is turned on.

15 Claims, 3 Drawing Sheets

LOW POWER LATCH SENSE AMPLIFIER

This application incorporates by reference of Taiwan application Serial No. 091100272, filed on Jan. 10, 2002.

BACKGROUND OF THE INVENTION

1. Field of the Invention

The invention relates in general to a low power latch sense amplifier, and more particularly to a low power latch sense amplifier used in a memory device.

2. Description of the Related Art

Non-volatile semiconductor memory is frequently used in many information technology products. Therefore, the need of greater memory capacity of a non-volatile semiconductor memory device increases as the technology grows.

The non-volatile semiconductor memory device includes a memory cell array. Each memory cell stores data of 1 or 0. The memory cell can be implemented by a metal-oxide semiconductor (MOS) with different threshold voltage according to the data to be stored. Bit lines are used for selecting one column of memory cells, and word lines are used for selecting one row of memory cells. Then, a selected memory cell is read under the control of a selected bit line and a selected word line, and the corresponding current signal of the bit line is transmitted to a sense amplifier to output a voltage signal corresponding to the current signal.

For a memory device having a great number of sense amplifiers operating at the same time, power consumption increases instantly. Therefore, reducing the power consumption of the sense amplifiers is an important topic for the persons skilled in the arts.

SUMMARY OF THE INVENTION

It is therefore an object of the invention to provide a low power latch sense amplifier to reduce the number of MOS and to lower the power consumption. Also, the swing of the bit line is decreased and the reliability of the memory cell array is increased because the voltage of the bit lines is clamped at a fixed voltage value in the invention.

It is another object of the invention to provide a low power latch sense amplifier for being electrically coupled to a bit line of a memory cell array. The low power latch sense amplifier comprises a common gate sense amplifier and an activated latch register. The common gate sense amplifier, which comprises a current source and a biased metal-oxide semiconductor, is applied for sensing the current of the bit line. The current source and the biased MOS are coupled to a first node, and the common gate sense amplifier outputs a sensing signal at the first node. The activated latch register comprises a first clock signal-synchronized inverter which includes a first inverter and a first switch. The first inverter outputs a first inverter output signal in response to the sensing signal. The first switch is controlled by a first set of control signal. The first inverter output signal corresponds to the sensing signal when the first switch is turned on. The latch sense amplifier takes the first inverter output signal as its output.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 2 illustrates the relation between the voltage of signal VZ and the current I of the first inverter when PMOS MP4 and NMOS MN4 are both turned on;

DETAILED DESCRIPTION OF THE INVENTION

Figure 1:
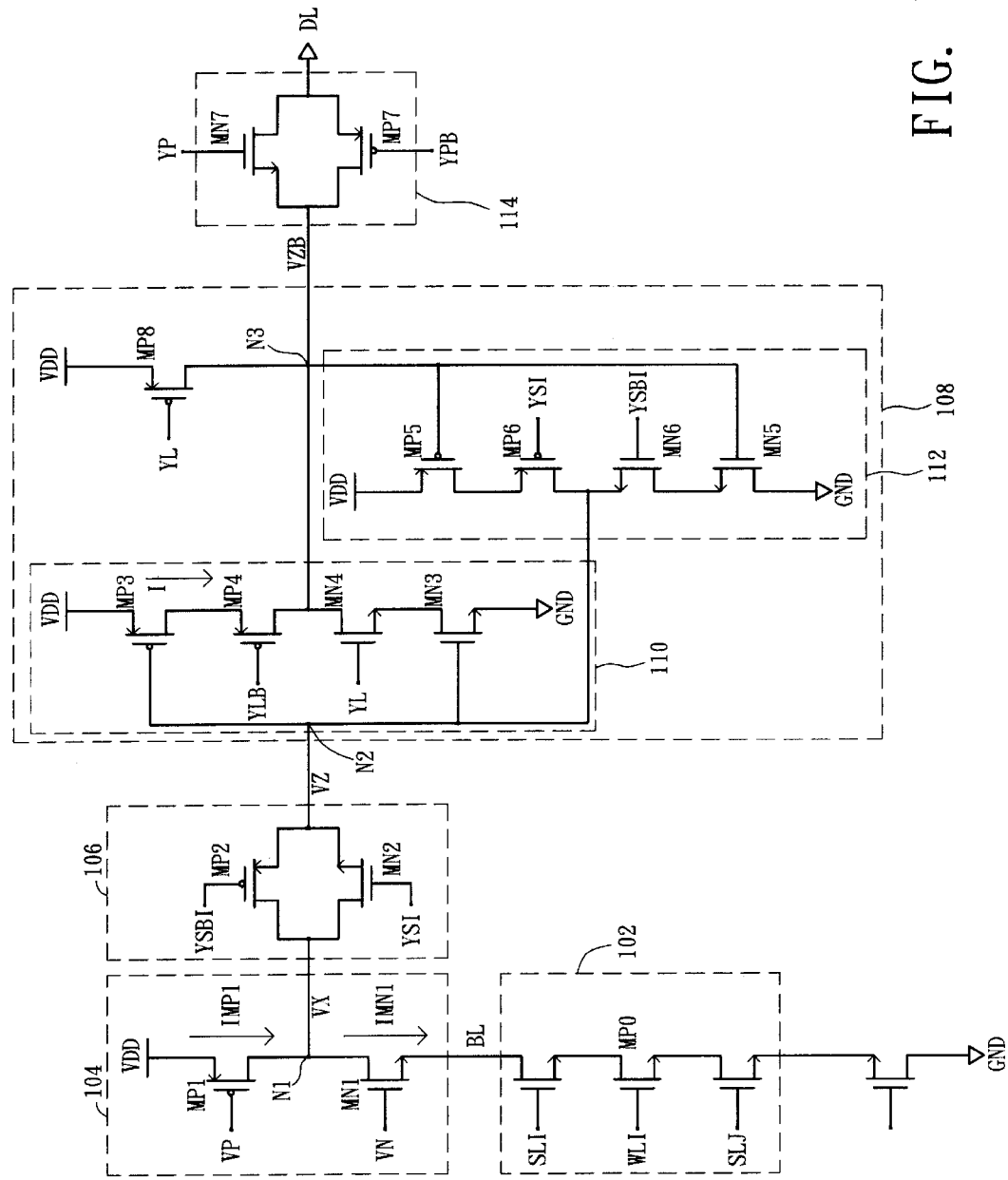
FIG. 1 illustrates a low power latch sense amplifier according to a preferred embodiment of the invention.

Please refer to FIG. 1, which illustrates a low power latch sense amplifier according to a preferred embodiment of the invention. The low power latch sense amplifier is electrically coupled to a bit ling BL of a memory cell array 102. The latch sense amplifier of the invention comprises a common gate sense amplifier 104 and an activated latch register 108, which has a first clock signal-synchronized inverter 110 and a second clock signal-synchronized inverter 112. By using the common gate sense amplifier 104, fewer circuit elements are needed and the reliability of the memory cell array 102 is improved due to the clamped voltage of the bit line BL. Besides, by regulating the time instant at which the first clock-synchronized inverter 110 and the second clock-synchronized inverter 112 are activated, power consumption can be reduced.

The memory cell array 102 is composed of a number of memory cells (MP0, for example) arranged in an array. Bit line BL is used to select one column of memory cells, and word line WL (WLI, for example) is used to select one row of memory cells. By controlling the voltage of the select lines SLI and SLJ, the selected memory cell MP0 is read, and the bit line BL outputs a corresponding current of the memory cell MP0.

The common gate sense amplifier 104 is used for detecting the current of the bit line BL. The common gate sense amplifier 104 comprises a current source compensating device, such as a biased P type metal-oxide semiconductor (PMOS) MP1, and a voltage clamping device, such as a biased N type metal-oxide semiconductor (NMOS) MN1. The drain of the PMOS MP1 and the drain of the NMOS MN1 are coupled to a first node N1. The common gate sense amplifier 104 outputs a sensing signal VX at the first node N1. The source of the NMOS MN1 is electrically coupled to the bit line BL to sense the current of the bit line BL.

The first clock signal-synchronized inverter 110 comprises a first inverter and first switch which are connected in series. When the first switch is turned on, the first inverter is activated. The first inverter is a complementary metal-oxide semiconductor (CMOS) inverter that is composed of a PMOS MP3 and an NMOS MN3, and the first switch is composed of a PMOS MP4 and NMOS MN4. The first switch has a first inverter input end N2 at which a signal VZ is inputted. The signal VZ is related to the sensing signal VX. The first switch is controlled by a first set of control signal that includes control signals YL and YLB. The first clock signal-synchronized inverter 110 outputs a first inverter output signal VZB, and the first inverter output signal VZB is corresponding to the magnitude of the signal VZ when the first switch is turned on.

The second clock signal-synchronized inverter 112 comprises a second inverter and a second switch which are connected in series. When the second switch is turned on, the second inverter is activated. The second inverter is a CMOS inverter that is composed of a PMOS MP5 and an NMOS MN5, and the second switch is composed of a PMOS MP6 and an NMOS MN6. The second inverter has a second inverter input end N3 at which the first inverter outputs signal VZB is inputted to the second clock signal-synchronized inverter 112. The second switch is controlled by a second set of control signal that includes control signals YSBI and YSI. The output signal of the second clock signal-synchronized inverter 112 is positively fed back to the first inverter input end N2 of the first clock signal-synchronized inverter 110 when the second switch is turned on. The low power latch sense amplifier takes the first inverter output signal VZB as output signal.

Besides, after the sensing signal VX is transmitted to a selected pass gate 106, a signal VZ is generated and inputted to the first clock signal-synchronized 110 of the activated latch register 108. The pass gate 106 is composed of a PMOS MP2 and an NMOS MN2, which are controlled by control signals YSBI and YSI respectively. Thus, when the pass gate 106 is turned on, the sensing signal VX is transmitted through the pass gate 106 and the signal VZ is outputted. In the low power latch sense amplifier, the pass gate 106 is turned on firstly at time instant t1, the first switch composed of PMOS MP4 and NMOS MN4 is turned on secondly at time instant t2, and the second switch composed of PMOS MP6 and NMOS MN6 is then turned on at time instant t3. At time instant t3, the pass gate 106 is turned off simultaneous.

Moreover, one activated latch register could be electrically coupled to several common gate sense amplifiers 104 via several pass gates 106. By using several control signals which are enabled at different time instants, several different bit lines BL could be read out one by one.

Besides, the activated latch register 108 could further comprise a PMOS MP8 to avoid voltage floating at the node N3. The first inverter output signal VZB could further be inputted to a pass gate 114 in the next stage to make a output signal DL more stable. The pass gate 114 is composed of a PMOS MP7 and an NMOS MN7.

The operation of the latch sense amplifier of the invention is described as follows.

The gate of PMOS MP1 and the gate of NMOS MN1 are biased by fixed voltages VP and VN respectively. The biased PMOS MP1 acts as a current source, and generates a reference current IMP1 which is between a logic 1 current and a logic 0 current of CMOS logic. The current of the biased NMOS MN1 is related to the voltage difference of the voltage VN and the voltage of the bit line BL. When a memory cell (MP0, for example) storing logic 1 is read, current IMN1 flows through the memory cell and the voltage of the bit line BL is almost zero. That is, the voltage of the bit line BL decreases from VN-VTN to $R_{cell}$*IMP1, wherein VTN is the threshold voltage of the NMOS MN1; and $R_{cell}$ is the effective resistance of block including the memory cell, such as block 102 indicated in FIG. 1. Since IMP1 tends to zero, the voltage of the bit line BL is almost zero in this case. Conversely, when a memory cell storing logic 0 is read, almost no current flows through the memory cell and the bit line BL is in high voltage. Thus, current IMN1 is smaller than the reference current IMP1, and the voltage of the sensing signal VX changes to high voltage level. Besides, the NMOS MN1 could clamp the voltage of bit line BL at the voltage VN-VTN, wherein VTN is the threshold voltage of the NMOS MN1. To be specific, the bit line voltage increases to VN-VTN as the memory cell storing logic 0 is read. During the increase of the bit line voltage, the current IMN1 reduces to zero and the voltage VX will increase so that the activated latch register can latch the voltage VZ. Therefore, the voltage swing of the bit line BL is effectively reduced, which is specifically between VN-VTN and $R_{cell}$*IMP1, and the reliability of the memory cell array 102 is improved.

After the sensing signal VX transmits through the pass gate 106, the signal VZ is generated and inputted to the first inverter, which is composed of PMOS MP3 and NMOS MN3. When PMOS MP4 and MNOS MN4 are turned on, the first clock signal-synchronized inverter 110 outputs the first inverter output signal VZB that is an inverse of the signal VZ. The first inverter output signal VZB is inputted to the second inverter, which is composed of PMOS MP5 and NMOS MN6. When PMOS MP6 and NMOS MN6 are turned on, the second clock signal-synchronized inverter 112 positively feeds back a signal which is the inverse of the first inverter output signal VZB to the first inverter input end N2 of the first clock-signal synchronized inverter 110.

Figure 2:
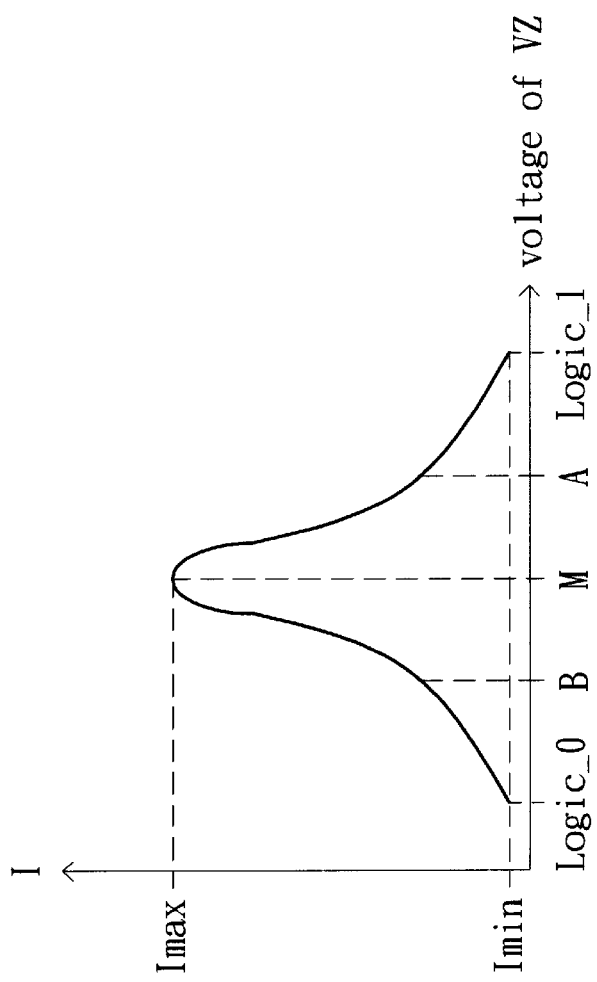

Please refer to FIG. 2, which illustrates the relation between the voltage of the signal VZ and the current I of the first inverter when PMOS MP4 and NMOS MN4 are both turned on. According to the characteristic of CMOS inverter, when the signal VZ inputted to the first inverter is in logic 1 voltage level (Logic_1) or logic 0 voltage level (Logic_1) of CMOS logic, the current I flows through the first inverter is a small current, for example, Imin. Oppositely, when the signal VZ inputted to the first inverter is in the middle between logic 1 voltage level Logic_1 and logic 0 voltage level Logic_0, the current I flows through the first inverter is a large current, for example, Imax. The voltage of the sensing signal VX changes when reading different memory cell with different data stored in. Due to the small current flowing through the memory cell, the voltage of the sensing signal VX changes slowly, and the voltage of the signal VZ changes slowly, too. When the voltage of signal VZ changes from Logic_1 to 1 Logic_0, or changes from Logic_0 to Logic_1, a high current, for example Imax, would be generated during the transition. Because the voltage of signal VZ changes slowly, high current flows through the first inverter for a long period during the transition. Consequently, the first inverter would consume a lot of power.

In order to solve the problem of power consumption described above, one can regulate the time instant when the control signals YL and YLB are enabled. The control signals YL and YLB are enabled after the voltage of the signal VZ approaching Logic_1 or Logic_0. For example, the control signals YL and YLB are enabled when the voltage of signal VZ is at a high voltage A or a low voltage B. After the control signals YL and YLB are enabled, the first inverter composed of PMOS MP4 and NMOS MN4 are turned on, and a low short circuit current is generated. Therefore, the object of reducing power consumption is achieved. During the voltage of the signal VZ changing from a high voltage A to a low voltage B, or changing from a low voltage B to a high voltage A, the first switch is not turned on, and no current flows through the first inverter. When the first switch is turned on, the voltage of signal VZ has changed to a high voltage A or a low voltage B, and the current flows through the first inverter is approximate to a low current Imin. Therefore, by regulating the time instant at which the first switch is turned on, large current of the first switch is avoided, and the power consumption of the first inverter is reduced.

Figure 3:
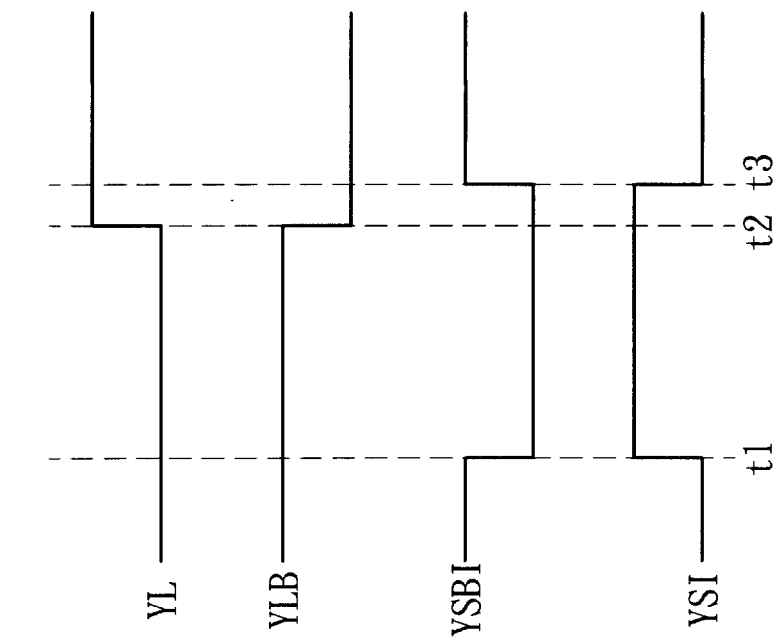
FIG. 3 illustrates an example of the control signals YL, YLB, and YSBI.

Please refer to FIG. 3, which illustrates an example of the control signals YL, YLB, and YSBI. If the signal VZ and the output signal of the second clock signal-synchronized inverter 112, which is the inverse of the first inverter output signal VZB, change their voltage level at the same time, the phenomenon of voltage fighting at the first inverter input end N2 will happen and the voltage at N2 will be unstable. To avoid this phenomenon, the second clock signal-synchronized inverter 112 is activated after the first clock signal-synchronized inverter 110 is activated by a time period. Please refer to FIGS. 2 and 3 simultaneously. Assume the signal VZ begins voltage transition at the time instant t1. Then, at the time instant t2, the voltage of signal VZ approaches Logic_1, for example, the voltage of signal VZ equals to high voltage level A. At the same time, PMOS MP4 and NMOS MN4 are turned on to activate the first clock-synchronized inverter 110. Upon being activated, the first clock-synchronized inverter 110 outputs the first inverter output signal VZB. Then, at the time instant t3, the PMOS MP6 and NMOS MN6 are turned on to activate the second clock signal-synchronized inverter 112. Upon being activated, the second clock signal-synchronized inverter 112 outputs a signal which is the inverse of the first inverter output signal VZB to the first inverter input end N2. Because the second clock signal-synchronized inverter 112 is activated after the first clock signal-synchronized inverter 110 is activated by a period of t3–t2, the phenomenon of voltage fighting and unstable voltage at the first inverter input end N2 can be avoided.

Furthermore, the signal VZ approaches Logic_1 or Logic_0 more quickly due to positive feedback from the first inverter output signal VZB to the first inverter input end N2. Referring to FIG. 2, when the signal VZ is in high voltage level, the voltage of the first inverter input end N2 is quickly pulled up to logic 1 voltage level by the positive feedback. Similarly, when the signal VZ is in low voltage level, the voltage of the first inverter input end N2 is quickly pulled down to logic 0 voltage level by the positive feedback. When the voltage of the first inverter input end N2 reaches the logic 1 voltage level or logic 0 voltage level, the current flows through the first clock signal-synchronized inverter 110 is merely about Imin. Therefore, only during the period of t2 to t3, large current flows through the first clock signal-synchronized inverter 110. Because the period of t2 to t3 is very short, the whole power consumption of the activated first clock signal-synchronized inverter 110 is small.

By the way of (a) activating the first clock signal-synchronized inverter 110 when the signal VZ approaches the logic 1 voltage level or logic 0 voltage level, and (b) activating the second clock signal-synchronized inverter 112 after the first clock signal-synchronized inverter 110 is activated by a time period, the power consumption of the first clock signal-synchronized inverter 110 is reduced.

Moreover, only two MOS are needed for the common gate sense amplifier 104 of the invention.

Figure 4:
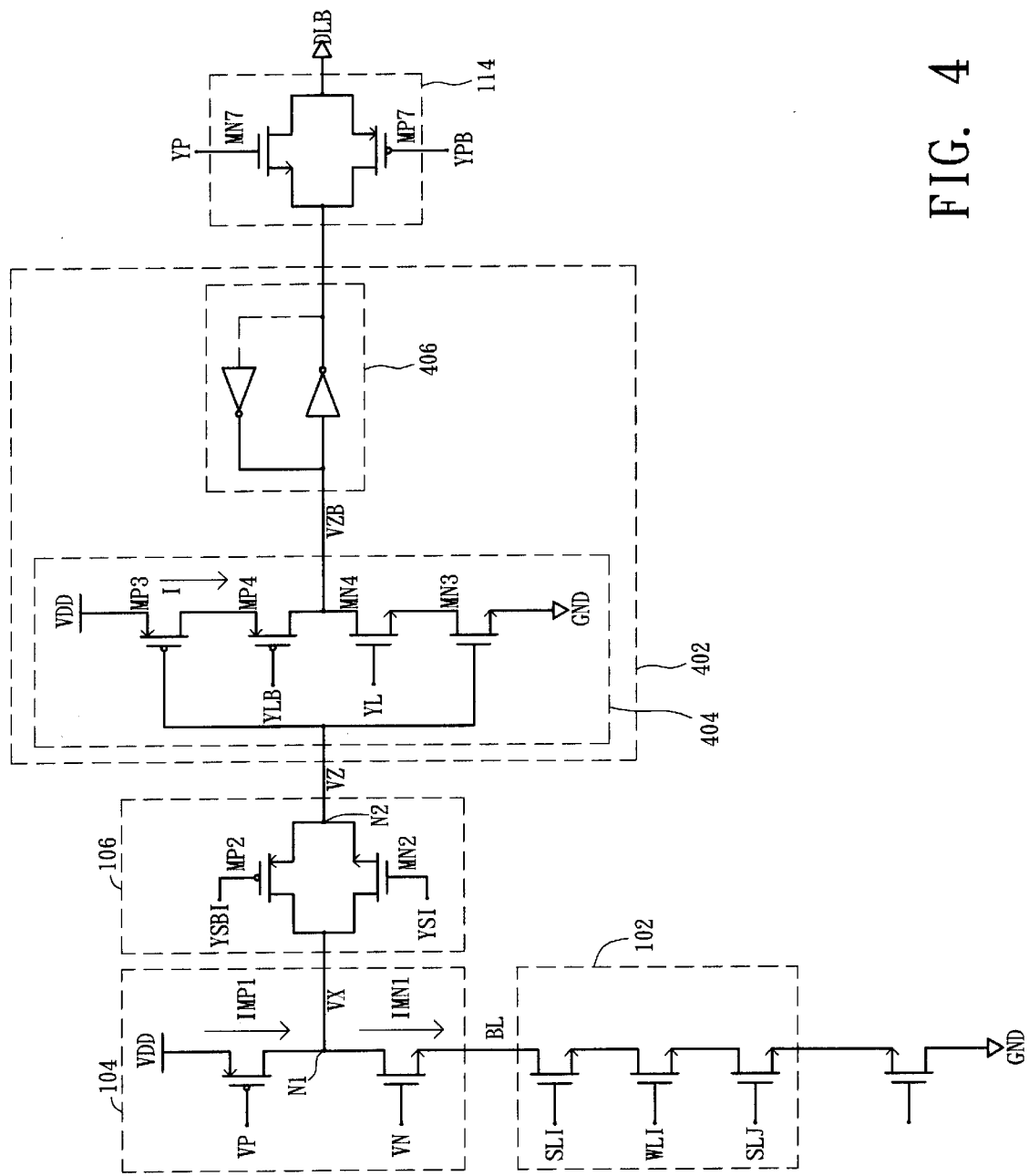
FIG. 4 illustrates another low power latch sense amplifier according to another embodiment of the invention.

Please refer to FIG. 4, which illustrates another low power latch sense amplifier according to another embodiment of the invention. Replace the activated latch register 108 in FIG. 1 by an activated latch register 402, the low power latch sense amplifier shown in FIG. 4 is obtained. The activated latch register 402 comprises a first clock signal-synchronized inverter 404 and a register 406. The clock signal-synchronized 404 is used to latch the first inverter output signal VZB, and the register 406 is used to store the first inverter output signal VZB. Compared with the latch sense amplifier in the FIG. 1, the latch sense amplifier shown in FIG. 4 has the advantage that only one set of control signal, i.e. the control signals YL and YLB, is needed.

The low power latch sense amplifier of the invention achieves the object of reducing the number of MOS and reducing power consumption. Moreover, because the voltage of the bit lines is clamped at a voltage value, the swing of the bit line is reduced and the reliability of the memory cell array is improved. Besides, due to the reduction of the swing of the bit line, the capacitance effect of the bit line is also reduced, so as to improve the speed of reading the data of the memory cell.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A latch sense amplifier for being electrically coupled to a bit line of a memory cell array, comprising:
    a common gate sense amplifier for sensing the current of the bit line, the common gate sense amplifier comprising:
        a current source compensating device for generating a reference current; and
        a voltage clamping device, coupled between the current source compensating device and the bit line, for clamping voltage of the bit line according to a fixed voltage applied to the voltage clamping device, the reference current, and the current of the bit line, wherein the voltage clamping device and the current source compensating device are coupled to a first node, the voltage clamping device is coupled between the current source compensating device and the bit line, and the common gate sense amplifier outputs a sensing signal at the first node; and
    an activated latch register, responding to the sensing signal, wherein the activated latch register comprises a first clock signal-synchronized inverter which includes a first inverter and a first switch, wherein the first inverter, in response to the sensing signal, outputs a first inverter output signal, the first switch is controlled by a first set of control signal, and the first inverter output signal corresponds to the sensing signal when the first switch is turned on;
    wherein the first set of control signal is activated to turn on the first switch when the sensing signal approaches either a logic 1 or logic 0 state, whereby the activated latch register consumes reduced energy.

2. The latch sense amplifier according to claim 1, wherein the activated latch register further comprises a second clock signal-synchronized inverter which comprises a second inverter and a second switch, the second inverter responds to the first inverter output signal, the second switch is controlled by a second set of control signal, the output of the second clock signal-synchronized inverter is positively fed back to the input of the first clock-synchronized inverter when the second switch is turned on, wherein the first switch is turned on before the second switch by a time period.

3. The latch sense amplifier according to claim 2, wherein the second inverter and the second switch are connected in series.

4. The latch sense amplifier according to claim 3, wherein the second inverter is a complementary metal-oxide semiconductor (CMOS) inverter.

5. The latch sense amplifier according to claim 1, wherein the activated latch register further comprises a register for storing the first inverter output signal.

6. The latch sense amplifier according to claim 1, wherein the first inverter and the first switch are connected in series, and the first inverter is activated when the first switch is turned on.

7. The latch sense amplifier according to claim 1, wherein the first inverter is a CMOS inverter.

8. The latch sense amplifier according to claim 1, wherein current source is a biased P type metal-oxide semiconductor (PMOS).

9. The latch sense amplifier according to claim 1, wherein the biased MOS is an N type metal-oxide semiconductor (NMOS).

10. The latch sense amplifier according to claim 1, further comprising a pass gate for passing the sensing signal to the activated latch register, wherein the common gate sense amplifier is electrically coupled to the activated latch register through the pass gate.

11. The latch sense amplifier according to claim 2, further comprising:
- a pass gate, coupled between the common gate sense amplifier and the activated latch register, for passing the sensing signal to the activated latch register, wherein the pass gate is controlled by the second set of control signal;
- wherein when the second set of control signal activates the pass gate, the second switch is turned off, and the first switch is turned off until the sensing signal approaches either a logic 0 or logic 1 state; when the second set of control signal deactivates the pass gate, the second switch is turned on.

12. A latch sense amplifier for being electrically coupled to a bit line of a memory cell array, the low power latch sense amplifier comprising:
- a common gate sense amplifier comprising:
  - a current source compensating device for generating a reference current; and
  - a voltage clamping device, coupled between the current source compensating device and the bit line, for clamping voltage of the bit line according to a fixed voltage applied to the voltage clamping device, the reference current and the current of the bit line, wherein the voltage clamping device and the current source compensating device are coupled to a first node, the voltage clamping device is coupled between the current source compensating device and the bit line, and the common gate sense amplifier outputs a sensing signal at the first node;
- a first clock signal-synchronized inverter comprising a first inverter, a first switch, and a first inverter input end, wherein a first signal corresponding to the sensing signal is applied to the first inverter input end, and the first clock-synchronized inverter outputs a first inverter output signal corresponding to the sensing signal by the first inverter when the first switch is turned on; and
- a second clock signal-synchronized inverter comprising a second inverter, a second switch, and a second inverter input end for receiving the first inverter output signal, wherein output of the second clock signal-synchronized inverter is positively fed back to the first inverter input end by the second inverter when the second switch is turned on;
- wherein the first switch is turned on when the first signal approaches either a logic 1 or logic 0 state, and the first switch is turned on before the second switch is turned on by a time period, and the latch sense amplifier outputs the first inverter output signal; whereby the activated latch register consumes reduced energy.

13. The latch sense amplifier according to claim 12, further comprising a pass gate for passing the sensing signal to the activated latch register, wherein the common gate sense amplifier electrically is coupled to the first clock signal-synchronized inverter through the pass gate.

14. The latch sense amplifier according to claim 12, further comprising:
- a pass gate, coupled between the common gate sense amplifier and the activated latch register, for passing the sensing signal to the activated latch register;
- wherein when the pass gate is turned on, the second switch is turned off, and the first switch is turned off until the sensing signal approaches either a logic 0 or logic 1 state; when the pass gate is turned off, the second switch is turned on.

15. A method for generating an output signal of a bit line of a memory cell array, with low power consumption, the method comprising the steps of:
- providing a reference current;
- detecting current of the bit line and obtaining a sensing signal by comparing the current of the bit line with the reference current; and
- latching the sensing signal in response to transition of the sensing signal, comprising the steps of:
  - generating a first inverter output signal which corresponds to the sensing signal when the sensing signal approaches either a logic 0 or logic 1 voltage level, wherein the first inverter output signal is generated from a first clock-synchronized inverter which includes a first inverter and a first switch; the first clock-synchronized inverter generates the first inverter output signal through the first inverter when the first switch is turned on; and the first switch is turned on when the sensing signal approaches either a logic 0 or logic 1 voltage level;
  - generating a second inverter output signal which is the inverse of the first inverter output signal;
  - positively feeding back the second inverter output signal to the first clock-synchronized inverter; and
  - outputting the first inverter output signal as the output signal of the bit line.

* * * * *